United States Patent
Lee

(10) Patent No.: US 10,163,961 B2
(45) Date of Patent: Dec. 25, 2018

(54) IMAGE SENSOR

(71) Applicant: SK hynix Inc., Gyeonggi-do (KR)

(72) Inventor: Cha-Young Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/607,110

(22) Filed: May 26, 2017

(65) Prior Publication Data

US 2018/0138229 A1    May 17, 2018

(30) Foreign Application Priority Data

Nov. 14, 2016   (KR) .......................... 10-2016-0151067

(51) Int. Cl.
*H01L 27/146*    (2006.01)

(52) U.S. Cl.
CPC .. *H01L 27/14641* (2013.01); *H01L 27/14621* (2013.01)

(58) Field of Classification Search
CPC .................................................. H01L 27/14641
USPC ................................................................ 257/432
See application file for complete search history.

(56) References Cited

U.S. PATENT DOCUMENTS

| | | | |
|---|---|---|---|
| 9,270,915 B2 | 2/2016 | Kido et al. | |
| 2008/0024529 A1* | 1/2008 | Asano | G09G 3/3233 345/697 |
| 2009/0140304 A1* | 6/2009 | Kudoh | H01L 27/14603 257/292 |
| 2011/0128400 A1* | 6/2011 | Wakano | H01L 27/14609 348/222.1 |
| 2011/0156104 A1* | 6/2011 | Yamaguchi | H01L 27/14603 257/222 |
| 2015/0373289 A1* | 12/2015 | Choi | H04N 5/378 348/272 |
| 2016/0093653 A1* | 3/2016 | Tatani | H01L 27/14603 257/225 |
| 2018/0090534 A1* | 3/2018 | Kim | H01L 27/14643 |
| 2018/0130834 A1* | 5/2018 | Lee | H01L 27/1463 |

* cited by examiner

*Primary Examiner* — Igwe U Anya

(74) *Attorney, Agent, or Firm* — IP & T Group LLP

(57) ABSTRACT

An image sensor may include a pixel array that includes a plurality of pixel blocks arranged in an M×N (where M and N are natural numbers) matrix structure, wherein, among the plurality of pixel blocks, when compared to any one pixel block as a first pixel block, any one pixel block as a second pixel block adjacent to the first pixel block in an M direction or an N direction has a planar shape that is obtained by inverting a planar shape of the first pixel block in the M direction. Each of the plurality of pixel blocks may include a light reception unit including a plurality of unit pixels which generate photocharges in response to incident light and are arranged in an m×n matrix structure to have a shared pixel structure; and a driving circuit suitable for outputting an image signal corresponding to the photocharges.

15 Claims, 12 Drawing Sheets

IMAGE SENSOR

CROSS-REFERENCE TO RELATED APPLICATION

This application claims priority under 35 U.S.C. § 119 to Korean Patent Application No. 10-2016-0151067 filed on Nov. 14, 2016 in the Korean Intellectual Property Office, the disclosure of which is incorporated herein by reference in its entirety.

TECHNICAL FIELD

Various embodiments generally relate to a semiconductor device fabrication technology, and more particularly, to an image sensor.

DISCUSSION OF THE RELATED ART

An image sensor converts an optical image into an electrical signal. Recently, due to developments in the computer and communication industries, a demand for an image sensor with improved performance has increased for various devices, such as digital cameras, camcorders, Personal Communication System (PCS), game machines, security cameras, medical micro-cameras, and robots.

SUMMARY

Various embodiments are directed to an image sensor with improved performance.

In an embodiment of the present invention, an image sensor may include a pixel array including a plurality of pixel blocks arranged in an M×N (where M and N are natural numbers) matrix structure, wherein, among the plurality of pixel blocks, when compared to any one pixel block as a first pixel block, any one pixel block as a second pixel block adjacent to the first pixel block in an M direction or an N direction has a planar shape that is obtained by inverting a planar shape of the first pixel block in the M direction. Each of the plurality of pixel blocks may include: a light reception unit including a plurality of unit pixels which generate photocharges in response to incident light and are arranged in an m×n (where m and n are natural numbers) matrix structure to have a shared pixel structure; and a driving circuit suitable for outputting an image signal corresponding to the photocharges.

The second pixel block is adjacent to the first pixel block in the M direction, a planar shape of any one pixel block among the plurality of pixel blocks which is adjacent to the first pixel block in the N direction may be the same as the planar shape of the first pixel block. The second pixel block is adjacent to the first pixel block in the N direction, a planar shape of any one pixel block among the plurality of pixel blocks which is adjacent to the first pixel block in the M direction may be the same as the planar shape of the first pixel block. Any one pixel block among the plurality of pixel blocks which is adjacent to the first pixel block in an oblique direction that has a slope with respect to the M direction or the N direction has a planar shape that is obtained by inverting the planar shape of the first pixel block in the M direction.

Furthermore, the image sensor may further include: a color filter array corresponding to the pixel array, wherein the color filter array comprises a plurality of color patterns which are arranged repeatedly to correspond to the plurality of pixel blocks, respectively, and wherein each of the plurality of color patterns comprises a plurality of color filters which correspond to the plurality of unit pixels, respectively. Colors of color filters respectively corresponding to any one unit pixel as a first unit pixel among the plurality of unit pixels in the first pixel block and any one unit pixel as a second unit pixel among the plurality of unit pixels in the second pixel block may be the same, a distance between the first unit pixel and the driving circuit of the first pixel block may be different from a distance between the second unit pixel and the driving circuit of the second pixel block.

In an embodiment of the present invention, an image sensor may include a pixel array including a plurality of pixel blocks arranged in a matrix structure, wherein, among the plurality of pixel blocks, when compared to any one pixel block as a first pixel block, any one pixel block as a second pixel block adjacent to the first pixel block in a row direction or a column direction has a planar shape that is left-right symmetrical to a planar shape of the first pixel block. Each of the plurality of pixel blocks may include: a light reception unit including a first unit pixel to a fourth unit pixel which generate photocharges in response to incident light and are arranged in a 2×2 matrix structure to have a shared pixel structure; and a driving circuit suitable for outputting an image signal corresponding to the photocharges.

The second pixel block is adjacent to the first pixel block in the row direction, a planar shape of any one pixel block among the plurality of pixel blocks which is adjacent to the first pixel block in the column direction may be the same as the planar shape of the first pixel block. The second pixel block is adjacent to the first pixel block in the column direction, a planar shape of any one pixel block among the plurality of pixel blocks which is adjacent to the first pixel block in the row direction may be the same as the planar shape of the first pixel block. Any one pixel block among the plurality of pixel blocks which is adjacent to the first pixel block in an oblique direction that has a slope with respect to the row direction or the column direction may have a planar shape that is left-right symmetrical to the planar shape of the first pixel block.

Furthermore the image sensor may further include: a color filter array corresponding to the pixel array, wherein the color filter array comprises a plurality of color patterns which are arranged repeatedly to correspond to the plurality of pixel blocks, respectively, and wherein each of the plurality of color patterns comprises a plurality of color filters corresponding to the first unit pixel to the fourth unit pixel, respectively. In each of the plurality of pixel blocks, the first unit pixel is positioned at a shortest distance from the driving circuit and the fourth unit pixel is positioned at a longest distance from the driving circuit, the first unit pixel, the second unit pixel, the third unit pixel and the fourth unit pixel in the first pixel block may be positioned at a left upper part, a right upper part, a left lower part and a right lower part, respectively, and the first unit pixel, the second unit pixel, the third unit pixel and the fourth unit pixel in the second pixel block may be positioned at a right upper part, a left upper part, a right lower part and a left lower part, respectively. Color filters corresponding to unit pixels of the same position in the first pixel block and the second pixel block, respectively, may be the same in color. Colors of color filters respectively corresponding to the first unit pixel of the first pixel block and the second unit pixel of the second pixel block may be the same, wherein colors of color filters respectively corresponding to the second unit pixel of the first pixel block and the first unit pixel of the second pixel block may be the same, wherein colors of color filters respectively corresponding to the third unit pixel of the first pixel block and the fourth unit pixel of the second pixel block may be the same, and wherein colors of color filters respectively corresponding to the fourth unit pixel of the first pixel block and the third unit pixel of the second pixel block may be the same.

In an embodiment of the present invention, an image sensor may include a pixel array including a plurality of pixel blocks arranged in an M×N (where M and N are natural numbers) matrix structure, wherein, among the plurality of pixel blocks, when compared to any one pixel block as a first pixel block, each of a planar shape of any one pixel block as a second pixel block adjacent to the first pixel block in an M direction and any one pixel block as a third pixel block adjacent to the first pixel block in an N direction a planar shape that is obtained by inverting a planar shape of the first pixel block in the M direction. Each of the plurality of pixel blocks may include: a light reception unit including a plurality of unit pixels which generate photocharges in response to incident light and are arranged in an m×n (where m and n are natural numbers) matrix structure to have a shared pixel structure; and a driving circuit suitable for outputting an image signal corresponding to the photocharges.

Each of a planar shape of any one pixel block among a plurality of pixel blocks adjacent to the second pixel block in the N direction and a planar shape of any one pixel block among a plurality of pixel blocks adjacent to the third pixel block in the direction may be the same as the planar shape of the first pixel block. In an oblique direction that has a slope with respect to the M direction or the N direction, a planar shape of any one pixel block among the plurality of pixel blocks adjacent to the first pixel block may be the same as the planar shape of the first pixel block, a planar shape of any one pixel block among the plurality of pixel blocks adjacent to the second pixel block may be the same as the planar shape of the second pixel block, and a planar shape of any one pixel block among the plurality of pixel blocks adjacent to the third pixel block may be the same as the planar shape of the third pixel block.

Furthermore, the image sensor may further include: a color filter array corresponding to the pixel array, wherein the color filter array comprises a plurality of color patterns which are arranged repeatedly to correspond to the plurality of pixel blocks, respectively, and wherein each of the plurality of color patterns comprises a plurality of color filters which correspond to the plurality of unit pixels, respectively. Colors of color filters respectively corresponding to any one unit pixel as a first unit pixel among the plurality of unit pixels in the first pixel block and any one unit pixel as a second unit pixel among the plurality of unit pixels in the second pixel block may be the same, a distance between the first unit pixel and the driving circuit of the first pixel block may be different from a distance between the second unit pixel and the driving circuit of the second pixel block. Colors of color filters respectively corresponding to any one unit pixel as a first unit pixel among the plurality of unit pixels in the first pixel block and any one unit pixel as a second unit pixel among the plurality of unit pixels in the third pixel block may be the same, a distance between the first unit pixel and the driving circuit of the first pixel block is different from a distance between the second unit pixel and the driving circuit of the second pixel block.

In an embodiment of the present invention, an image sensor may include a pixel array including a plurality of sub pixel arrays, each sub pixel array including at least two pixel blocks arranged in a symmetrical configuration, each pixel block including at least four unit pixels arranged in a shared pixel structure; and wherein the image sensor is suitable for merging image signals from the at least two pixel blocks in each sub pixel array to prevent differences in the image signals.

DETAILED DESCRIPTION

Figure 1:
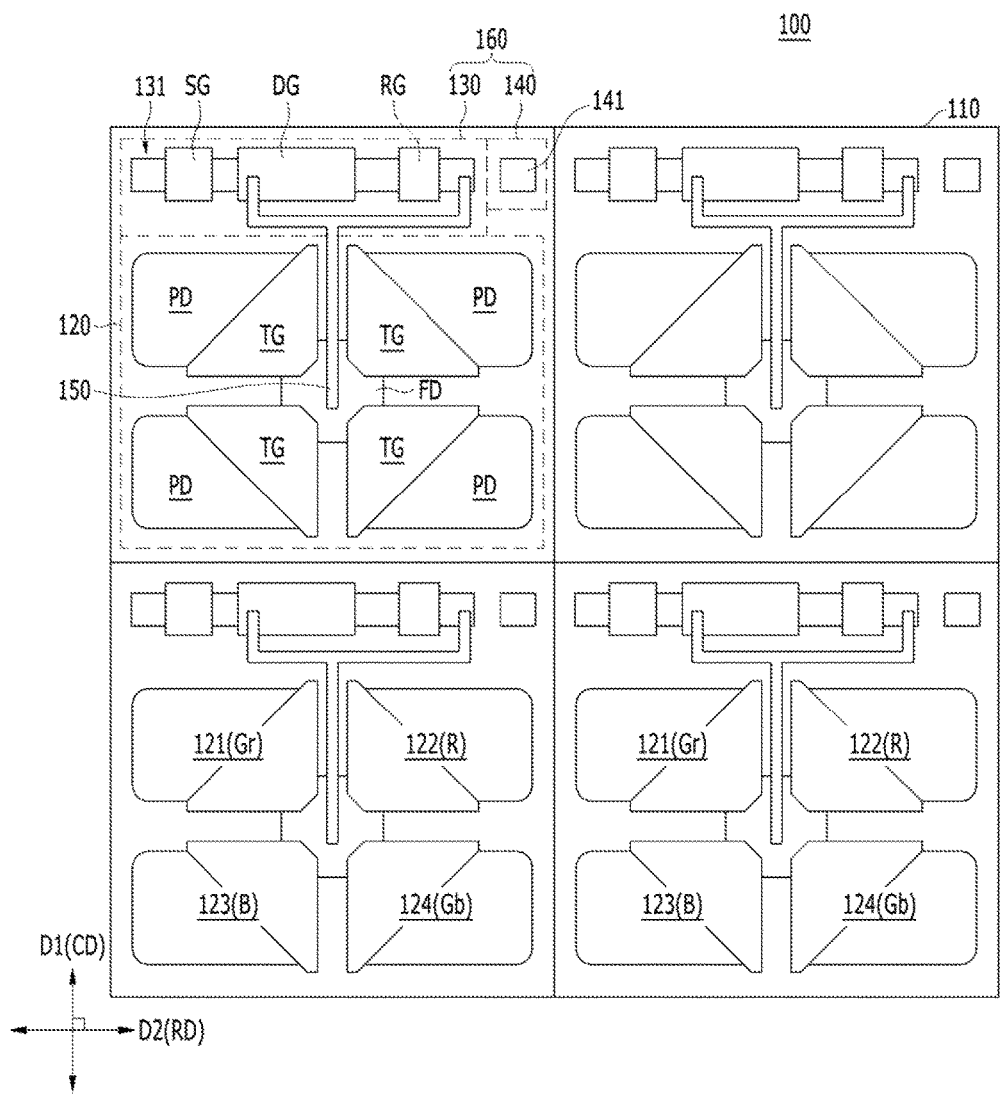
FIG. 1 is a plan view illustrating a portion of a pixel array of an image sensor according to a comparative example of the present disclosure.

Various embodiments will be described below in more detail with reference to the accompanying drawings. The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The following embodiments provide an image sensor with improved performance, e.g., an image sensor capable of providing a High-resolution image. The image sensor may have a shared pixel structure. Various embodiments of the present disclosure provide an image sensor employing an improved shared pixel structure for providing a High-resolution image and for substantially reducing or preventing any differences in the image signals outputted from the plurality of the unit pixels. For reference, the difference in the image signals is due to the offset, e.g., fixed pattern noise FPN.

Hereinafter, a reason why a difference is caused in the image signals outputted from respective unit pixels in a shared pixel structure image sensor is described with reference to FIGS. 1 and 2.

Figure 2:
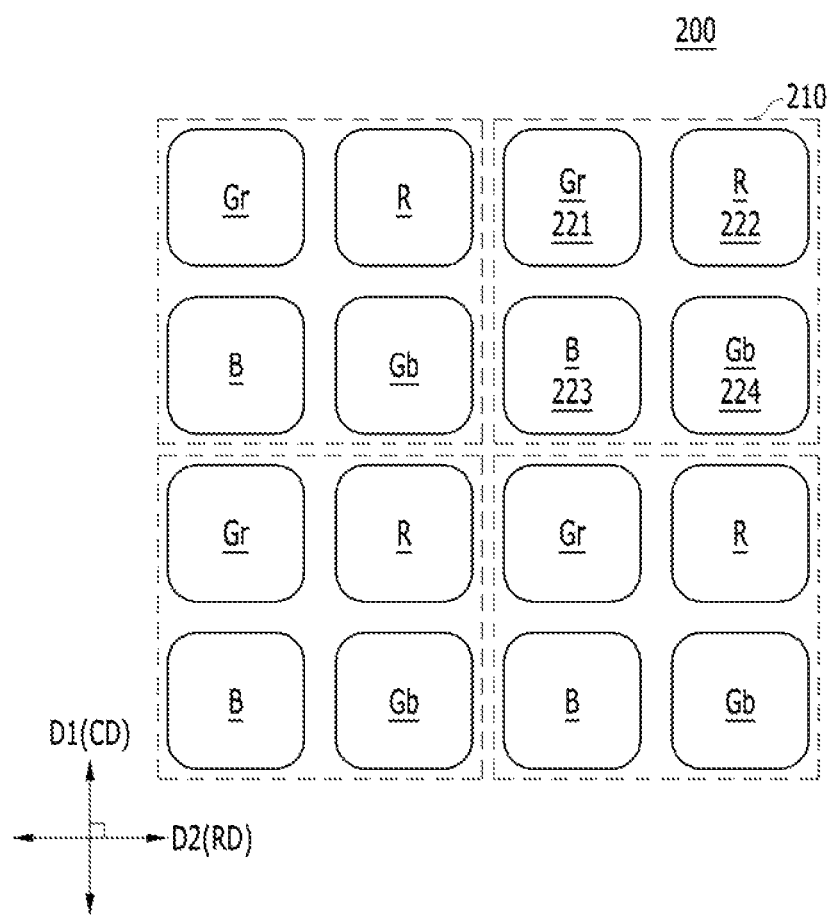
FIG. 2 is a plan view illustrating a portion of a color filter array corresponding to the portion of the pixel array of the image sensor according to the comparative example shown in FIG. 1.

FIG. 1 is a plan view illustrating a portion of a pixel array of an image sensor according to a comparative example of the present disclosure. FIG. 2 is a plan view illustrating a portion of a color filter array corresponding to the portion of the pixel array of the image sensor according to the comparative example shown in FIG. 1.

Referring to FIG. 1, the image sensor according to the comparative example may include a pixel array 100 in which a plurality of pixel blocks 110 are arranged in a two-dimensional matrix. The plurality of pixel blocks 110 may be arranged to have the same planar shape (also referred to as planar configuration) in both a first direction D1 and a second direction D2. Each of the plurality of pixel blocks 110 may include a plurality of unit pixels 121 to 124 which are arranged in an m×n (where m and n are natural numbers) matrix shared pixel structure. Hereafter, in this comparative example, descriptions will be made by exemplifying the case where each of the plurality of pixel blocks 110 has a 4-shared pixel structure which includes 4 unit pixels 121 to 124 arranged in a 2×2 matrix, shared pixel structure.

Each of the plurality of pixel blocks 110 may include a light reception unit 120, a conductive line 150 and a driving circuit 160. The light reception unit 120 may include the plurality of unit pixels 121 to 124 having a shared pixel structure and may generate photocharges in response to incident light. The driving circuit 160 may output an image signal corresponding to the photocharges generated by the light reception unit 120. The conductive line 150 may electrically couple the light reception unit 120 and the driving circuit 160. The driving circuit 160 may include an output unit 130 which includes a plurality of pixel transistors, and a pickup unit 140 which controls ground potential. While not shown in the drawing, the light reception unit 120, the output unit 130 and the pickup unit 140 may be isolated by an isolation structure.

The light reception unit 120 may Include the plurality of unit pixels 121 to 124 which share a floating diffusion FD. For example, the light reception unit 120 may include a first unit pixel 121 to a fourth unit pixel 124 which are disposed to surround the floating diffusion FD. The floating diffusion FD may be positioned centrally in the light reception unit 120, the first unit pixel 121 may be disposed at a shortest distance from the driving circuit 160, and the fourth unit pixel 124 may be disposed at a longest distance from the driving circuit 160. The output unit 130 in the driving circuit 160 may serve as a reference for the distances between each of the first to the fourth unit pixels 124 and the driving circuit 160. The light reception unit 120 has a rectangular shape divided in four equal parts with the first unit pixel 121, the second unit pixel 122, the third unit pixel 123 and the fourth unit pixel 124 positioned at the left upper part, the right upper part, the left lower part and the right lower part, respectively. Each of the first to the fourth unit pixels 121 to 124 may include a photoelectric conversion element PD which generates photocharges in response to incident light and a transfer transistor which transfers the photocharges generated in the photoelectric conversion element PD, to the floating diffusion FD in response to a transfer signal. The transfer signal may be applied to a transfer gate TG, and the photoelectric conversion element PD and the floating diffusion FD may serve as the source and the drain of the transfer transistor, respectively.

The output unit 130 may generate an image signal corresponding to the photocharges generated by the light reception unit 120, and output the image signal to a column line (not shown) in response to a select signal applied through a row line (not shown). The output unit 130 may include a reset transistor, a driver transistor and a selection transistor. The reset transistor, the driver transistor and the selection transistor may share one active region 131, and include a reset gate RG, a driver gate DG and a selection gate SG, respectively. The active region may have an elongated shape with the driver gate DG positioned at the center of the active region 131, and the reset and the selection gates RG, SG positioned at either side of the driver gate DG in the second direction D2, respectively. Junction regions (that is, sources and drains) may be formed in the active region 131 at both sides of the reset gate RG, the driver gate DG and the selection gate SG. The conductive line 150 may be coupled to the junction region (for example, source) at one side of the reset gate RG and to the driver gate DG, and the column line may be coupled to the junction region at the other side of the selection gate SG. A power supply voltage (VDD) may be applied to the junction region between the driver gate DG and the reset gate RG. The row line may be coupled to the selection gate SG. The driving circuit 160 may be positioned at one side of the light reception unit 120 in the first direction D1. The output unit 130 and the pickup unit 140 may be aligned in the second direction D2. The first and the second directions D1, D2 may be a column and a row direction CD, RD, respectively.

The conductive line 150 may electrically couple the floating diffusion FD of the light reception unit 120 with the driver gate DG and the source of the reset transistor of the output unit 130.

The pickup unit 140 may control the ground potential of the light reception unit 120 and the output unit 130, and may include a pickup region 141. The pickup region 141 may include an impurity region which is formed in a substrate, and a predetermined bias may be applied to the substrate formed with the light reception unit 120 and the output unit 130, through the pickup region 141. Similarly to the output unit 130, the pickup unit 140 may be positioned at one side of the light reception unit 120 in the first direction D1, side by side with the output unit 130. Referring to FIG. 2, the image sensor according to the comparative example may include a color filter array 200 corresponding to the pixel array 100. The color filter array 200 may include a plurality of color patterns 210 which are arranged repeatedly to correspond to the plurality of pixel blocks 110, respectively.

Each of the plurality of color patterns 210 may include a plurality of color filters 221 to 224 corresponding to the plurality of unit pixels 121 to 124, respectively. For example, each of the plurality of color patterns 210 may include a first color filter 221 to a fourth color filter 224 corresponding to the first unit pixel 121 to the fourth unit pixel 124, respectively. For example, each of the plurality of color patterns 210 may be a Bayer pattern including a red R a green Gr, a blue B and a second green Gb filter. More specifically, the first color filter 221, the second color filter 222, the third color filter 223 and the fourth color filter 224 may be a first green filter Gr, a red filter R, a blue filter B and a second green filter Gb, respectively.

In the above-described image sensor according to the comparative example, it may be seen that, because each of the plurality of pixel blocks 110 has the shared pixel structure, all the planar shapes of the first unit pixel 121 to the fourth unit pixel 124 including adjacent structures in the pixel block 110 are different. In detail, the first unit pixel 121 which is positioned at the left upper part in the pixel block 110 may have a planar shape in which the photoelectric conversion element PD and the transfer gate TG are disposed adjacent to the selection gate SG, the driver gate DG and the conductive line 150. The second unit pixel 122 which is positioned at the right upper part in the pixel block 110 may have a planar shape in which the photoelectric conversion element PD and the transfer gate TG are disposed adjacent to the reset gate RG, the pickup region 141 and the conductive line 150. The third unit pixel 123 which is positioned at the left lower part in the pixel block 110 may have a planar shape that is adjacent to the first unit pixel 121 and has a longest distance from the pickup region 141 in the pixel block 110. The fourth unit pixel 124 which is positioned at the right lower part in the pixel block 110 may have a planar shape that is adjacent to the second unit pixel 122 and has a longest distance from the selection gate SG in the pixel block 110. Expressed otherwise, it may be seen that, in the pixel block 110, all the distances between the driving circuit 160, that is, the output unit 130 or the pickup unit 140, and each of the first unit pixel 121 to the fourth unit pixel 124 are different. In this way, because the planar shapes of the first unit pixel 121 to the fourth unit pixel 124 including the adjacent structures in the pixel block 110 or the distances between the first unit pixel 12 to the fourth unit pixel 124 and the driving circuit 160 are all different, even though the amounts of the photocharges generated in the first unit pixel 121 to the fourth unit pixel 124 in response to incident light are all the same, signals outputted through the output unit 130 cannot help but be all different. Namely, different levels of interference, for example, parasitic capacitance, induced between adjacent structures, may be caused in the image signals outputted by respective unit pixels, due to the different distances of the unit pixels from the driving circuit in the various pixel blocks.

Moreover, because the plurality of color patterns 210 are disposed to correspond to the plurality of pixel blocks 110, respectively, the differences in the image signals may become significant. This is because an image signal corresponding to the incident light discolored by the first color filter 221 is outputted from only the first unit pixel 121 and is not outputted from the other unit pixels, that is, the second unit pixel 122 to the fourth unit pixel 124, in each of the plurality of pixel blocks 110. That is to say, because the image signal corresponding to the incident light discolored by the first color filter 221 is not outputted from the second unit pixel 122 to the fourth unit pixel 124 which have different planar shapes from the first unit pixel 121, the differences in the image signals outputted from the respective unit pixels become significant.

In the following embodiments of the present disclosure, detailed descriptions will be made for an image sensor capable of preventing differences from being caused in the image signals outputted from respective unit pixels when a shared pixel structure is adopted as described above in the comparative example.

Figure 3:
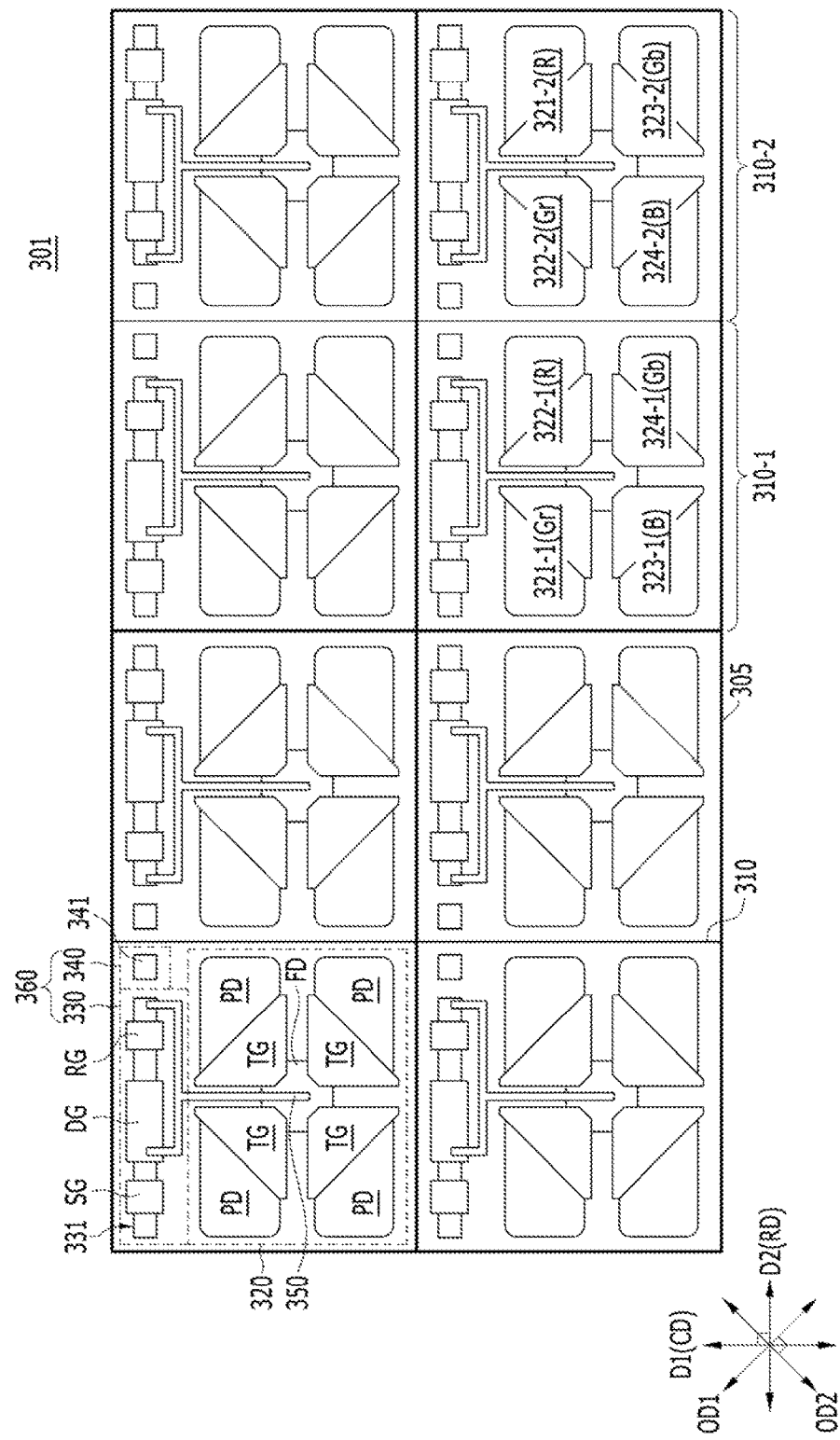
FIG. 3 is a plan view illustrating a portion of a pixel array of an image sensor in accordance with a first embodiment of the present invention.
Figure 4:
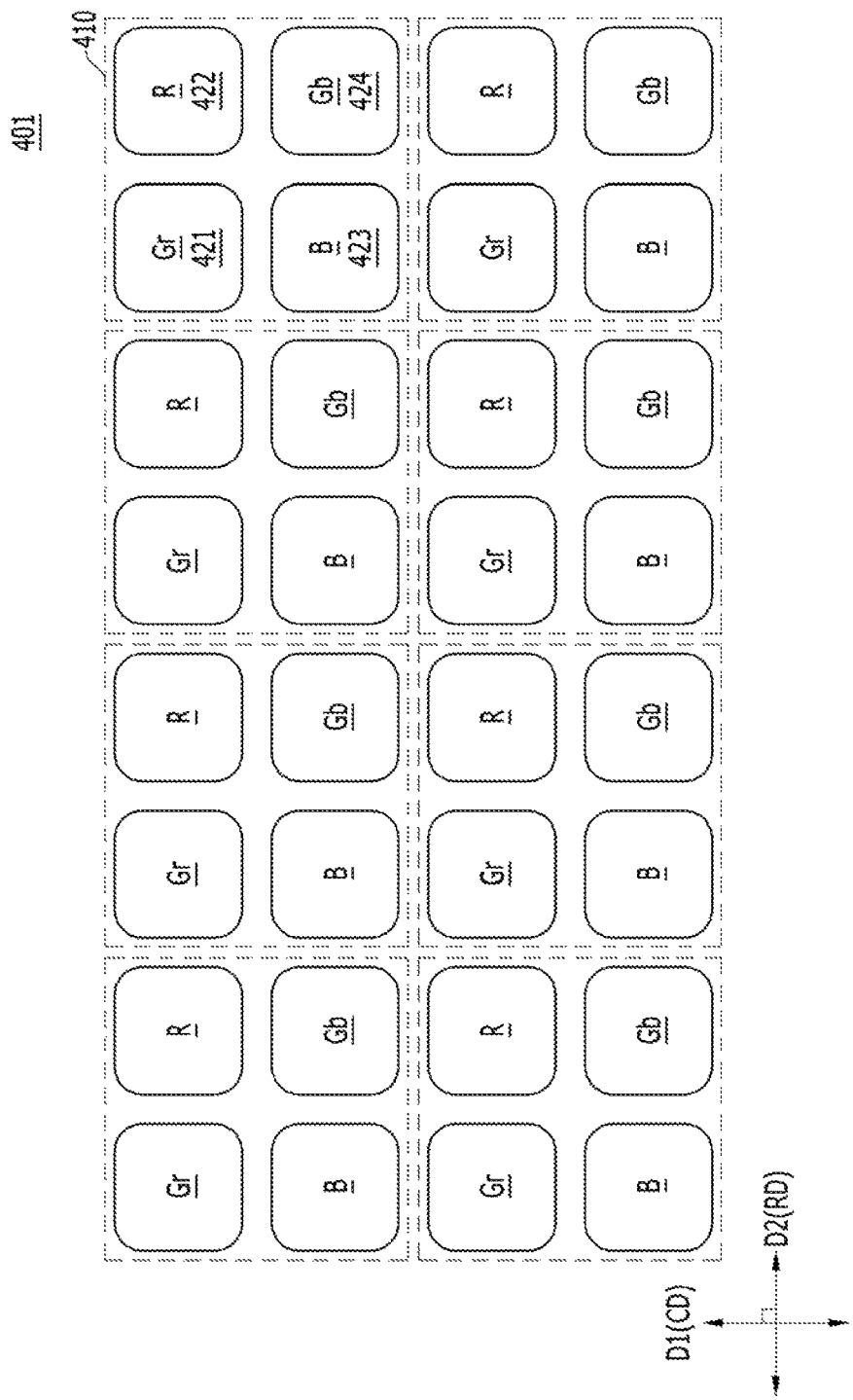
FIG. 4 is a plan view illustrating a portion of a color filter array corresponding to the portion of the pixel array of the image sensor in accordance with the first embodiment of the present invention.

FIG. 3 is a plan view illustrating a portion of a pixel array of an image sensor in accordance with a first embodiment of the present invention, and FIG. 4 is a plan view illustrating a portion of a color filter array corresponding to the portion of the pixel array of the image sensor in accordance with the first embodiment of the present invention.

Referring to FIG. 3, the image sensor in accordance with the first embodiment may include a pixel array 301 in which a plurality of sub pixel arrays 305 are arranged two-dimensionally. Each of the plurality of sub pixel arrays 305 may include a plurality of pixel blocks 310 which are arranged in a matrix structure. Thus, the pixel array 301 may include a plurality of pixel blocks 310 which are arranged in an M×N (where M and N are natural numbers) matrix structure. That is to say, the pixel array 301 may include the plurality of pixel blocks 310 which are arranged in an M direction and an N direction. The M direction and the N direction may be a row direction RD and a column direction CD, respectively. Each of the plurality of pixel blocks 310 may include a plurality of unit pixels which are arranged in an m×n (where m and n are natural numbers) matrix structure and have a shared pixel structure. For example, in the first embodiment of the present invention, each of the plurality of sub pixel arrays 305 may include a (1,1) first pixel block 310-1 and a (1,2) second pixel block 310-2 which are arranged in a 1×2 matrix structure. Similarly to the comparative example, each of the plurality of pixel blocks 310 may have a 4-shared pixel structure which includes 4 unit pixels arranged in a 2×2 matrix structure. This is for the sake of convenience in explanation, and it is to be noted that the image sensor in accordance with the first embodiment may have a $2^n$ (where n is a natural number)-shared pixel structure. For example, in other embodiments each unit pixel may have an 8- or a 16-shared pixel structure.

Descriptions will be made later for each of the plurality of pixel blocks 310.

Referring to FIG. 4, the image sensor in accordance with the first embodiment may include a color filter array 401 corresponding to the pixel array 301. The color filter array 401 may include a plurality of color patterns 410 which are arranged repeatedly to correspond to the plurality of pixel blocks 310, respectively. Each of the plurality of color patterns 410 may include a plurality of color filters corresponding to a plurality of unit pixels, respectively. Each of the plurality of color filters may be a single filter including any one or a multi-filter including at least two, selected from the group consisting of a red filter, a green filter, a blue filter, a cyan filter, a yellow filter, a magenta filter, a white filter, a black filter, an IR cutoff filter, an IR pass filter and a band pass filter which passes a specific wavelength band.

For example, each of the plurality of color patterns 410 may include a first color filter 421 to a fourth color filter 424 which are arranged in a 2×2 matrix structure and correspond to a plurality of unit pixels, respectively. In each of the plurality of color patterns 410, the first color filter 421, the second color filter 422, the third color filter 423 and the fourth color filter 424 may be positioned at a left upper part, a right upper part, a left lower part and a right lower part, respectively, and may have the same layout shape over the entire color filter array 401. For example, each of the plurality of color patterns 410 may be a Bayer pattern in which a red filter R, a green filter Gr, a blue filter and a second green filter Gb are repeated. In other words, the first color filter 421, the second color filter 422, the third color filter 423 and the fourth color filter 424 may be a first green filter Gr, a red filter R, a blue filter B and a second green filter Gb, respectively.

While the first embodiment illustrates the case where each of the plurality of color patterns 410 is a Bayer pattern, it is to be noted that various other color patterns may be applied. For example, each of the plurality of color patterns 410 may be a WRGB pattern which includes a white filter W, a red filter R, a green filter G and a blue filter B.

Referring again to FIG. 3, in the image sensor in accordance with the first embodiment of the present invention, in order to prevent differences from occurring in the image signals outputted from respective unit pixels in a shared pixel structure the plurality of pixel blocks 310 in each of the plurality of sub pixel arrays 305 may have planar shapes that are symmetrical to each other.

In detail, in the pixel array 301, the plurality of pixel blocks 310 may be arranged in the M×N (where M and N are natural numbers) matrix structure. Among the plurality of pixel blocks 310, when compared to an (M,N) pixel block 310, each of the planar shapes of an (M,N+1) pixel block 310 and an (M,N−1) pixel block 310 which are adjacent to the (M,N) pixel block 310 in the M direction may be obtained by inverting the planar shape of the (M,N) pixel block 310 in the M direction. In other words, each of the (M,N+1) pixel block 310 and the (M,N−1) pixel block 310 may have a planar shape that is symmetrical to the planar shape of the (M,N) pixel block 310 along an axis of symmetry passing though interface of the two pixel blocks and extending along the first direction D1. Hereinafter, we will refer to such symmetry as symmetry in the second direction D2 or a left to right symmetry for simplicity. Hence, each of the planar shapes of the (M,N+1) pixel block 310 and the (M,N−1) pixel block 310 may be left-right symmetrical, or symmetrical in the second direction D2 to the planar shape of the (M,N) pixel block 310.

The planar shapes of an (M−1,N) pixel block 310 and an (M+1,N) pixel block 310 which are adjacent to the (M,N) pixel block 310 in the N direction may be the same as the planar shape of the (M,N) pixel block 310. The planar shape of a pixel block 310 adjacent to the (M,N) pixel block 310 in an oblique direction OD1 or OO2 that has a predetermined slope with respect to the M direction or the N direction, for example, an (M+1,N+1) pixel block 310, may be obtained by inverting the planar shape of the (M,N) pixel block 310 in the M direction. Namely, the planar shape of the (M+1, N+1) pixel block 310 may be the same as the planar shape of the (M,N+1) pixel block 310 and the planar shape of the (M,N−1) pixel block 310. The N direction and the M direction may be a first direction D1 and the second direction D2, respectively, and the first direction D1 and the second direction D2 may be the column direction CD and the row direction RD, respectively.

In the image sensor in accordance with the first embodiment of the present invention, each of the plurality of sub pixel arrays 305 may include the (1,1) first pixel block 310-1 and the (1,2) second pixel block 310-2 which are arranged in the 1×2 matrix structure. The planar shape of the second pixel block 310-2 may be obtained by inverting the planar shape of the first pixel block 310-1 in the second direction D2. That is to say, when compared to the planar shape of the first pixel block 310-1, the second pixel block 310-2 may have a planar shape that is symmetrical, that is, left-right symmetrical, to the first pixel block 310-1 in the second direction D2. In each of the plurality of pixel blocks 310, when a first unit pixel 321 is disposed at a shortest distance from a driving circuit 360, for example, an output unit 330, and a fourth unit pixel 324 is disposed at a longest distance from the driving circuit 360, the first pixel block 310-1 and the second pixel block 310-2 may have planar shapes that are symmetrical to each other. Therefore, the layout of the plurality of unit pixels in the first pixel block 310-1 and the layout of the plurality of unit pixels in the second pixel block 310-2 may be different from each other. For example, in the first pixel block 310-1, a first unit pixel 321-1, a second unit pixel 322-1, a third unit pixel 323-1 and a fourth unit pixel 324-1 may be positioned at a left upper part, a right upper part, a left lower part and a right lower part, respectively. Conversely, in the second pixel block 310-2, a first unit pixel 321-2, a second unit pixel 322-2, a third unit pixel 323-2 and a fourth unit pixel 324-2 may be positioned at a right upper part, a left upper part, a right lower part and a left lower part, respectively. In this regard, while, in the comparative example, the positions of the first unit pixel 121 to the fourth unit pixel 124 are all the same in the plurality of respective pixel blocks 110, in the first embodiment of the present invention, it may be seen that the positions of the first unit pixel 321-1 to the fourth unit pixel 324-1 in the first pixel block 310-1 are all different from the positions of the first unit pixel 321-2 to the fourth unit pixel 324-2 in the second pixel block 310-2.

Conversely, since the plurality of color patterns 410 of FIG. 4 corresponding to the plurality of pixel blocks 310 of FIG. 3, respectively, have the same pattern type, the colors of color filters corresponding to unit pixels of the same position in the first pixel block 310-1 and the second pixel block 310-2 are the same. For example, the first color filter 421 may correspond to each of the first unit pixel 321-1 of the first pixel block 310-1 and the second unit pixel 322-2 of the second pixel block 310-2. The second color filter 422 may correspond to each of the second unit pixel 322-1 of the first pixel block 310-1 and the first unit pixel 321-2 of the second pixel block 310-2. The third color filter 423 may correspond to each of the third unit pixel 323-1 of the first pixel block 310-1 and the fourth unit pixel 324-2 of the second pixel block 310-2. The fourth color filter 424 may correspond to each of the fourth unit pixel 324-1 of the first pixel block 310-1 and the third unit pixel 323-2 of the second pixel block 310-2.

In the image sensor in accordance with the first embodiment of the present invention, while al the positions of the first unit pixels 321 to the fourth unit pixels 324 in the respective pixel blocks 310 of each sub pixel array 305 are different, because the color patterns 410 corresponding to the respective pixel blocks 310 retain a predetermined pattern type, it is possible to prevent differences from being caused in the image signals outputted from the respective unit pixels, even though the shared pixel structure is adopted. In detail, in the sub pixel array 305, unit pixels corresponding to color filters of the same color, for example, the first unit pixel 321-1 in the first pixel block 310-1 and the second unit pixel 322-2 in the second pixel block 310-2 corresponding to first color filters 421 cannot help but have different planar shapes. Namely, the distance between the first unit pixel 321-1 and the output unit 330 in the first pixel block 310-1 cannot help but be different from the distance between the second unit pixel 322-2 and the output unit 330 in the second pixel block 310-2. Due to this fact, the image signals outputted by the first unit pixel 321-1 in the first pixel block 310-1 and the second unit pixel 322-2 in the second pixel block 310-2 cannot help but be different from each other. However, by merging the different image signals outputted from the unit pixels of the first pixel block 310-1 and the second pixel block 310-2 by the unit of at least one sub pixel array 305, it is possible to prevent differences in the merged image signals from each sub pixel array 305.

For reference, in the comparative example, an image signal corresponding to incident light discolored by any one color filter is outputted from only any one unit pixel having the same planar shape in each of the plurality of pixel blocks 110. However, in the image sensor in accordance with the first embodiment of the present invention, since an image signal is outputted from a plurality of unit pixels which have different planar shapes, it is possible to prevent differences from being caused in the image signals outputted from the respective unit pixels.

Figure 5:
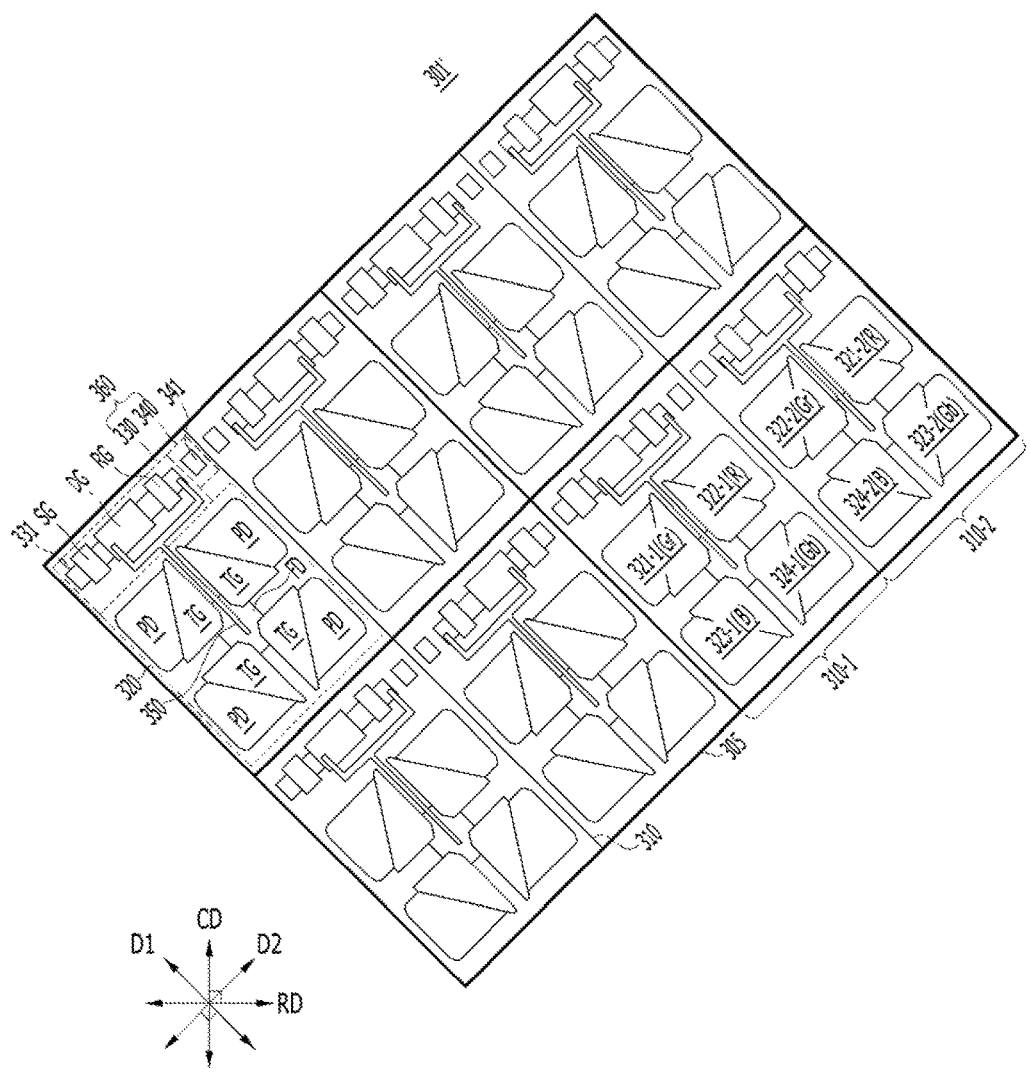
FIG. 5 is a plan view illustrating a portion of a pixel array of an image sensor in accordance with a variation of the first embodiment of the present invention.

FIG. 5 is a plan view illustrating a portion of a pixel array of an image sensor in accordance with a variation of the first embodiment of the present invention. For the sake of convenience in explanation, the same reference symbols as the first embodiment will be used herein.

Referring to FIG. 5, the image sensor in accordance with the variation of the first embodiment may include a pixel array 301' in which a plurality of sub pixel arrays 305 are arranged two-dimensionally. Each of the plurality of sub pixel arrays 305 may include a plurality of pixel blocks 310 which are arranged in a matrix structure. Thus, the pixel array 301' may include a plurality of pixel blocks 310 which are arranged in an M×N (where M and N are natural numbers) matrix structure. That is to say, the pixel array 301' may include a plurality of pixel blocks 310 which are arranged in a first direction D1 and a second direction D2. The first direction D1 and the second direction D2 may be oblique directions that cross with each other and have slopes with respect to a row direction RD or a column direction CD. The pixel array 301' in accordance with the variation of the first embodiment may be advantageous in securing the layout and interval of wiring lines which extend in the row direction RD and the column direction CD.

Figure 6:
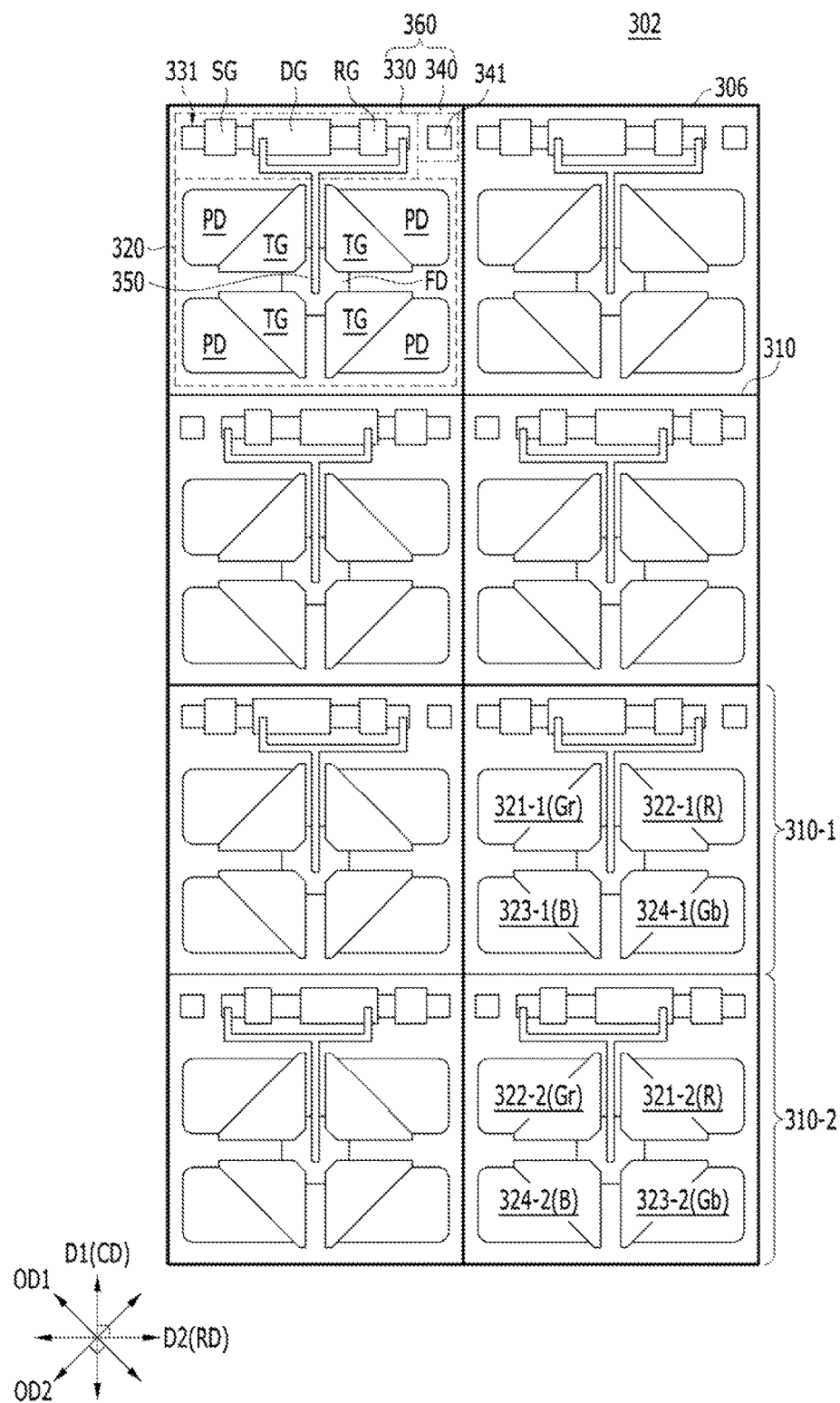
FIG. 6 is a plan view illustrating a portion of a pixel array of an image sensor in accordance with a second embodiment of the present invention.
Figure 7:
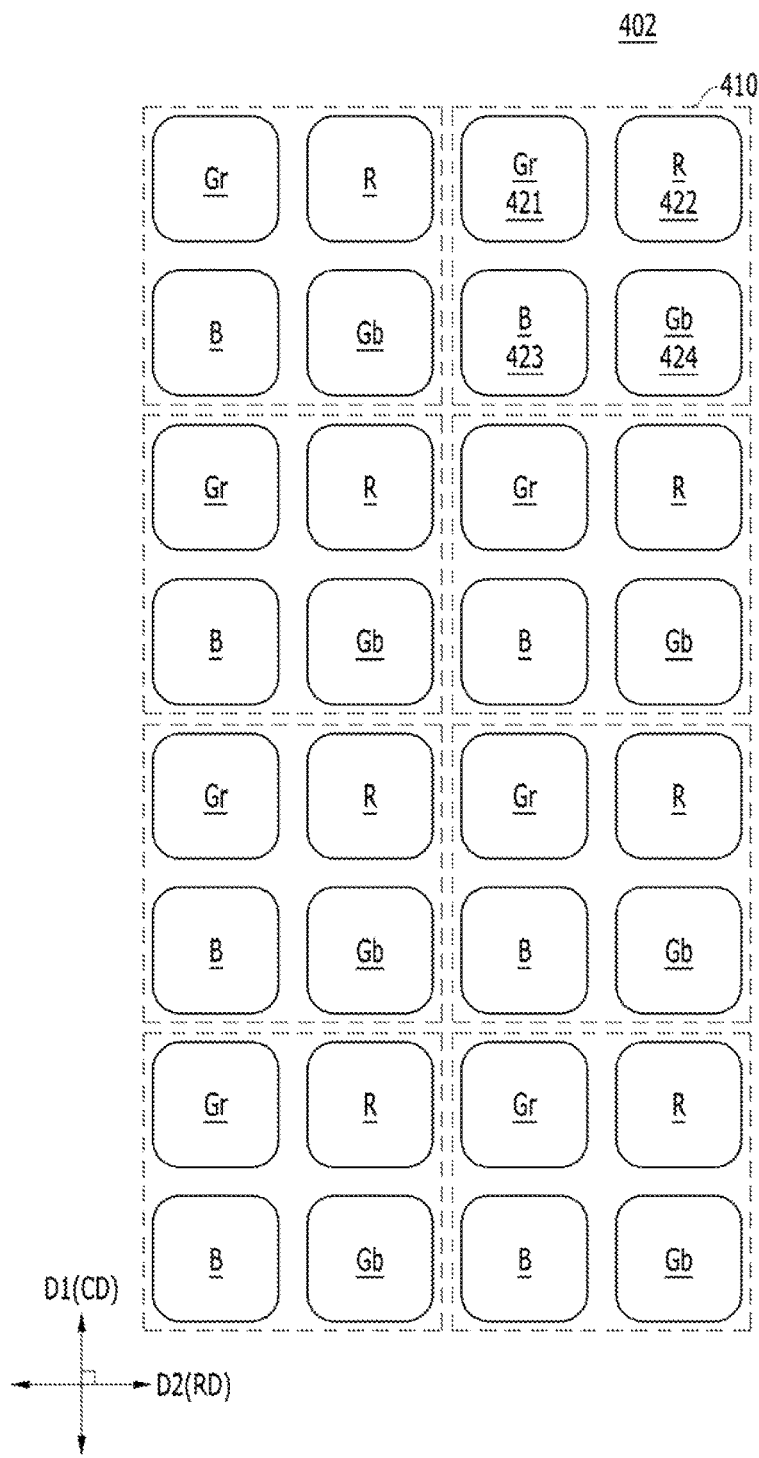
FIG. 7 is a plan view illustrating a portion of a color filter array corresponding to the portion of the pixel array of the image sensor in accordance with the second embodiment of the present invention.

FIG. 6 is a plan view illustrating a portion of a pixel array of an image sensor in accordance with a second embodiment of the present invention, and FIG. 7 is a plan view illustrating a portion of a color filter array corresponding to the portion of the pixel array of the image sensor in accordance with the second embodiment of the present invention. For the sake of convenience in explanation, the same reference symbols as the first embodiment will be used herein.

Referring to FIG. 6, the image sensor in accordance with the second embodiment may include a pixel array 302 in which a plurality of sub pixel arrays 306 are arranged two-dimensionally. Each of the plurality of sub pixel arrays 306 may include a plurality of pixel blocks 310 which are arranged in a matrix structure. Thus, the pixel array 302 may include a plurality of pixel blocks 310 which are arranged in an M×N (where M and N are natural numbers) matrix structure. That is to say, the pixel array 302 may include the plurality of pixel blocks 310 which are arranged in an M direction and an N direction. The M direction and the N direction may be a row direction RD and a column direction CD, respectively. Each of the plurality of pixel blocks 310 may include a plurality of unit pixels which are arranged in an m×n (where m and n are natural numbers) matrix structure and have a shared pixel structure.

For example, in the second embodiment of the present invention, each of the plurality of sub pixel arrays 306 may include a (1,1) first pixel block 310-1 and a (2,1) second pixel block 310-2 which are arranged in a 2×1 matrix structure. Similarly to the comparative example, each of the plurality of pixel blocks 310 may have a 4-shared pixel structure which includes 4 unit pixels arranged in a 2×2 matrix structure. This is for the sake of convenience in explanation, and it is to be noted that the image sensor in accordance with the second embodiment may have a $2^n$ (where n is a natural number)-shared pixel structure. Descriptions will be made later for each of the plurality of pixel blocks 310.

Referring to FIG. 7, the image sensor in accordance with the second embodiment may include a color filter array 402 corresponding to the pixel array 302. The color filter array 402 may include a plurality of color patterns 410 which are arranged repeatedly to correspond to the plurality of pixel blocks 310, respectively. Each of the plurality of color patterns 410 may include a plurality of color filters corresponding to a plurality of unit pixels, respectively. Each of the plurality of color filters may be a single filter including any one or a multi-filter including at least two, selected from the group consisting of a red filter, a green filter, a blue filter, a cyan filter, a yellow filter, a magenta filter, a white filter, a black filter, an IR cutoff filter, an IR pass filter and a band pass filter which passes a specific wavelength band. For example, each of the plurality of color patterns 410 may include a first color filter 421 to a fourth color filter 424 which are arranged in a 2×2 matrix structure and correspond to a plurality of unit pixels, respectively. In each of the plurality of color patterns 410, the first color filter 421, the second color filter 422, the third color filter 423 and the fourth color filter 424 may be positioned at a left upper part, a right upper part a left lower part and a right lower part, respectively, and may have the same layout shape over the entire color filter array 402. For example, each of the plurality of color patterns 410 may be a Bayer pattern in which a red filter R, a green filter Gr, a blue filter B, and a second green filter Gb are repeated. In other words, the first color filter 421, the second color filter 422, the third color filter 423 and the fourth color filter 424 may be a first green filter Gr, a red filter R, a blue filter B and a second green filter Gb, respectively.

Meantime, while the second embodiment illustrates the case where each of the plurality of color patterns 410 is a Bayer pattern, it is to be noted that various other color patterns may be applied. For example, each of the plurality of color patterns 410 may be a WRGB pattern which includes a white filter W, a red filter R, a green filter G and a blue filter B.

Referring again to FIG. 6, in the image sensor in accordance with the second embodiment of the present invention, in order to prevent differences from being caused in the image signals outputted from respective unit pixels in a shared pixel structure the plurality of pixel blocks 310 in each of the plurality of sub pixel arrays 306 may have planar shapes that are symmetrical to each other.

In detail in the pixel array 302, the plurality of pixel blocks 310 may be arranged in the M×N (where M and N are natural numbers) matrix structure. Among the plurality of pixel blocks 310, when compared to an (M,N) pixel block 310, each of the planar shapes of an (M+1,N) pixel block 310 and an (M−1,N) pixel block 310 which are adjacent to the (M,N) pixel block 310 in the N direction may be obtained by inverting the planar shape of the (M,N) pixel block 310 in the M direction. In other words, each of the (M+1,N) pixel block 310 and the (M−1,N) pixel block 310 may have a planar shape that is symmetrical to the planar shape of the (M,N) pixel block 310 in a second direction D2.

Namely, each of the planar shapes of the (M+1,N) pixel block 310 and the (M−1,N) pixel block 310 may be one that is left-right symmetrical to the planar shape of the (M,N) pixel block 310.

The planar shapes of an (M,N+1) pixel block 310 and an (M,N−1) pixel block 310 which are adjacent to the (M,N) pixel block 310 in the M direction may be the same as the planar shape of the (M,N) pixel block 310. The planar shape of a pixel block 310 adjacent to the (M,N) pixel block 310 in an oblique direction OD1 or OD2 that has a predetermined slope with respect to the M direction or the N direction, for example, an (M+1,N+1) pixel block 310, may be obtained by inverting the planar shape of the (M,N) pixel block 310 in the M direction. Namely, the planar shape of the (M+1,N+1) pixel block 310 may be the same as the planar shape of the (M+1,N) pixel block 310 and the planar shape of the (M−1,N) pixel block 310. The N direction and the M direction may be a first direction D1 and the second direction D2, respectively, and the first direction D1 and the second direction D2 may be the column direction CD and the row direction RD, respectively.

In the image sensor in accordance with the second embodiment of the present invention, each of the plurality of sub pixel arrays 306 may include the (1,1) first pixel block 310-1 and the (2,1) second pixel block 310-2 which are arranged in the 2×1 matrix structure. The planar shape of the second pixel block 310-2 may be obtained by inverting the planar shape of the first pixel block 310-1 in the second direction D2. That is to say, when compared to the planar shape of the first pixel block 310-1, the second pixel block 310-2 may have a planar shape that is symmetrical, that is, left-right symmetrical, to the first pixel block 310-1 in the second direction D2. In each of the plurality of pixel blocks 310, when a first unit pixel 321 is disposed at a shortest distance from a driving circuit 360, for example, an output unit 330, and a fourth unit pixel 324 is disposed at a longest distance from the driving circuit 360, the first pixel block 310-1 and the second pixel block 310-2 may have planar shapes that are left-right symmetrical to each other. Therefore, the layout of the plurality of the unit pixels in the first pixel block 310-1 and the layout of the plurality of the unit pixels in the second pixel block 310-2 may be different from each other. For example, in the first pixel block 310-1, a first unit pixel 321-1, a second unit pixel 322-1, a third unit pixel 323-1 and a fourth unit pixel 324-1 may be positioned at a left upper part, a right upper part, a left lower part and a right lower part, respectively. Conversely, in the second pixel block 310-2, a first unit pixel 321-2, a second unit pixel 322-2, a third unit pixel 323-2 and a fourth unit pixel 324-2 may be positioned at a right upper part, a left upper part a right lower part and a left lower part, respectively. In this regard, while, in the comparative example, the positions of the first unit pixel 121 to the fourth unit pixel 124 are all the same in the plurality of respective pixel blocks 110, in the present second embodiment of the present invention, it may be seen that the positions of the first unit pixel 321-1 to the fourth unit pixel 324-1 in the first pixel block 310-1 are all different from the positions of the first unit pixel 321-2 to the fourth unit pixel 324-2 in the second pixel block 310-2.

Conversely, since the plurality of color patterns 410 of FIG. 7 corresponding to the plurality of pixel blocks 310 of FIG. 6, respectively, have the same pattern type, the colors of color filters corresponding to unit pixels of the same position in the first pixel block 310-1 and the second pixel block 310-2 are the same. For example, the first color filter 421 may correspond to each of the first unit pixel 321-1 of the first pixel block 310-1 and the second unit pixel 322-2 of the second pixel block 310-2. The second color filter 422 may correspond to each of the second unit pixel 322-1 of the first pixel block 310-1 and the first unit pixel 321-2 of the second pixel block 310-2. The third color filter 423 may correspond to each of the third unit pixel 323-1 of the first pixel block 310-1 and the fourth unit pixel 324-2 of the second pixel block 310-2. The fourth color filter 424 may correspond to each of the fourth unit pixel 324-1 of the first pixel block 310-1 and the third unit pixel 323-2 of the second pixel block 310-2.

Hence, in accordance with the second embodiment of the present invention, an image sensor is provided having a shared pixel structure with all the positions of the first unit pixels 321 to the fourth unit pixels 324 in the respective pixel blocks 310 of each sub pixel array 306 being different, and the color patterns 410 corresponding to the respective pixel blocks 310 having the same predetermined pattern type. The image sensor is capable of preventing differences in the image signals outputted from the respective unit pixels by merging the signals outputted from the unit pixels of the first and second pixel blocks of a sub-pixel array. For example, in more detail, in the sub pixel array 306 of FIG. 6, unit pixels corresponding to color filters of the same color, for example, the first unit pixel 321-1 in the first pixel block 310-1 and the second unit pixel 322-2 in the second pixel block 310-2 corresponding to first color filters 421 have different distances from the output unit 330. Due to this, the image signals outputted by the first unit pixel 321-1 in the first pixel block 310-1 and the second unit pixel 322-2 in the second pixel block 310-2 are different from each other. However, by merging the different image signals outputted from the unit pixels of the first pixel block 310-1 and the second pixel block 310-2 by the unit of at least one sub pixel array 306, it is possible to prevent differences from being caused in the image signals outputted from each sub pixel array 306.

Figure 8:
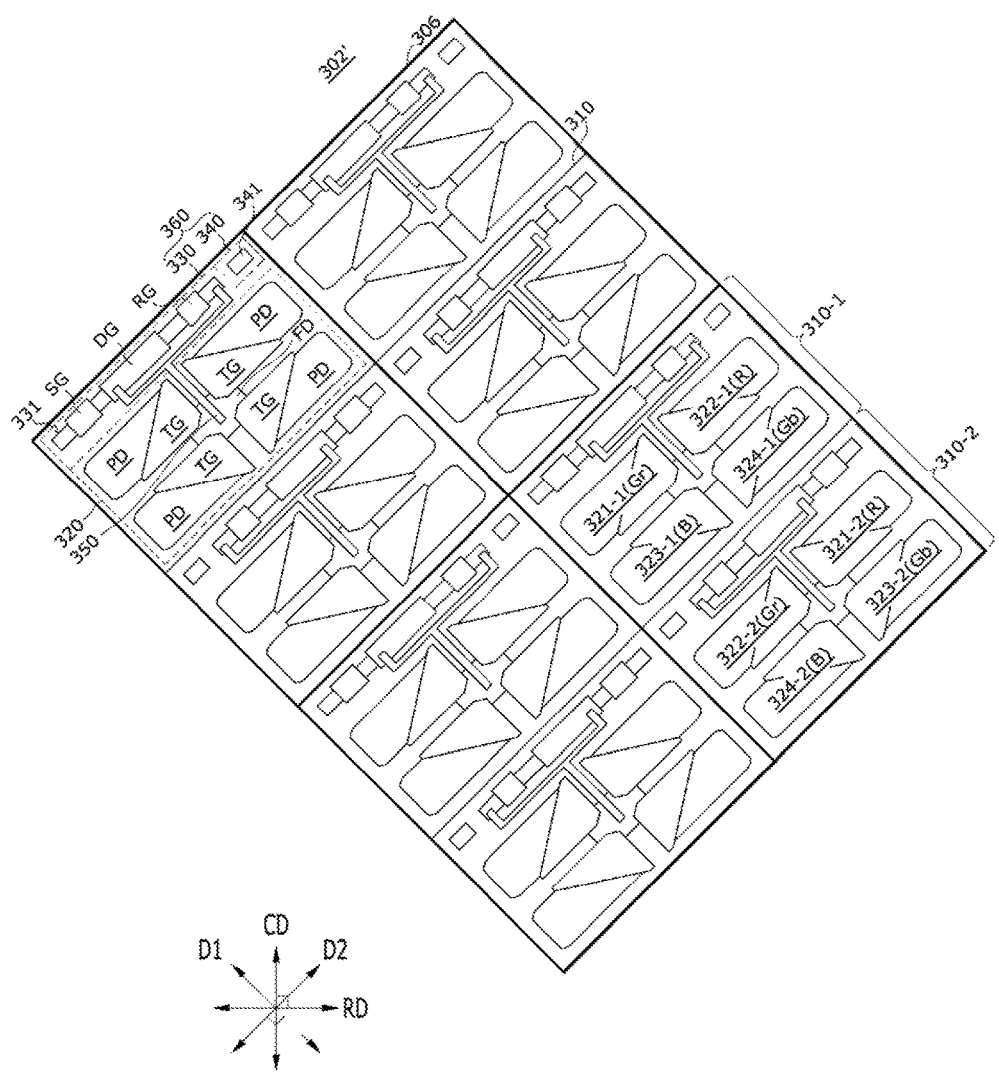
FIG. 8 is a plan view illustrating a portion of a pixel array of an image sensor in accordance with a variation of the second embodiment of the present invention.

FIG. 8 is a plan view illustrating a portion of a pixel array of an image sensor in accordance with a variation of the second embodiment of the present invention. For simplicity, the same reference symbols as the second embodiment are used herein.

Referring to FIG. 8, the image sensor in accordance with a variation of the second embodiment may include a pixel array 302' in which a plurality of sub pixel arrays 306 are arranged two-dimensionally. Each of the plurality of sub pixel arrays 306 may include a plurality of pixel blocks 310 which are arranged in a 2×1 matrix structure. The pixel array 302' may include a plurality of pixel blocks 310 which are arranged in an M×N (where M and N are natural numbers) matrix structure. That is to say, the pixel array 302' may include a plurality of pixel blocks 310 which are arranged in a first direction D1 and a second direction D2. The first direction D1 and the second direction D2 may be oblique directions that cross with each other and have slopes with respect to a row direction RD or a column direction CD. The pixel array 302' in accordance with the variation of the second embodiment may be advantageous in securing the layout and interval of wiring lines which extend in the row direction RD and the column direction CD.

Figure 9:
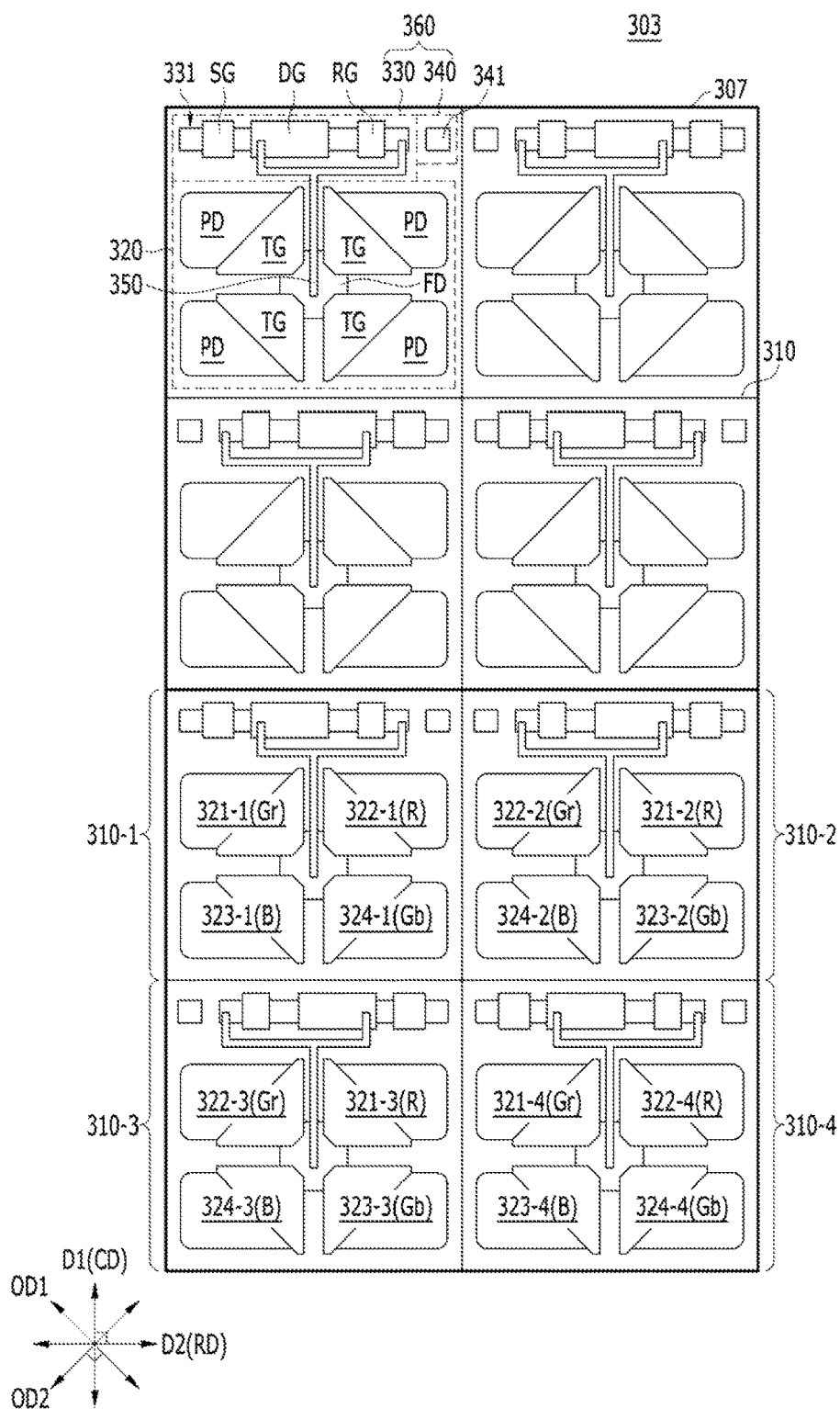
FIG. 9 is a plan view illustrating a portion of a pixel array of an image sensor in accordance with a third embodiment of the present invention.
Figure 10:
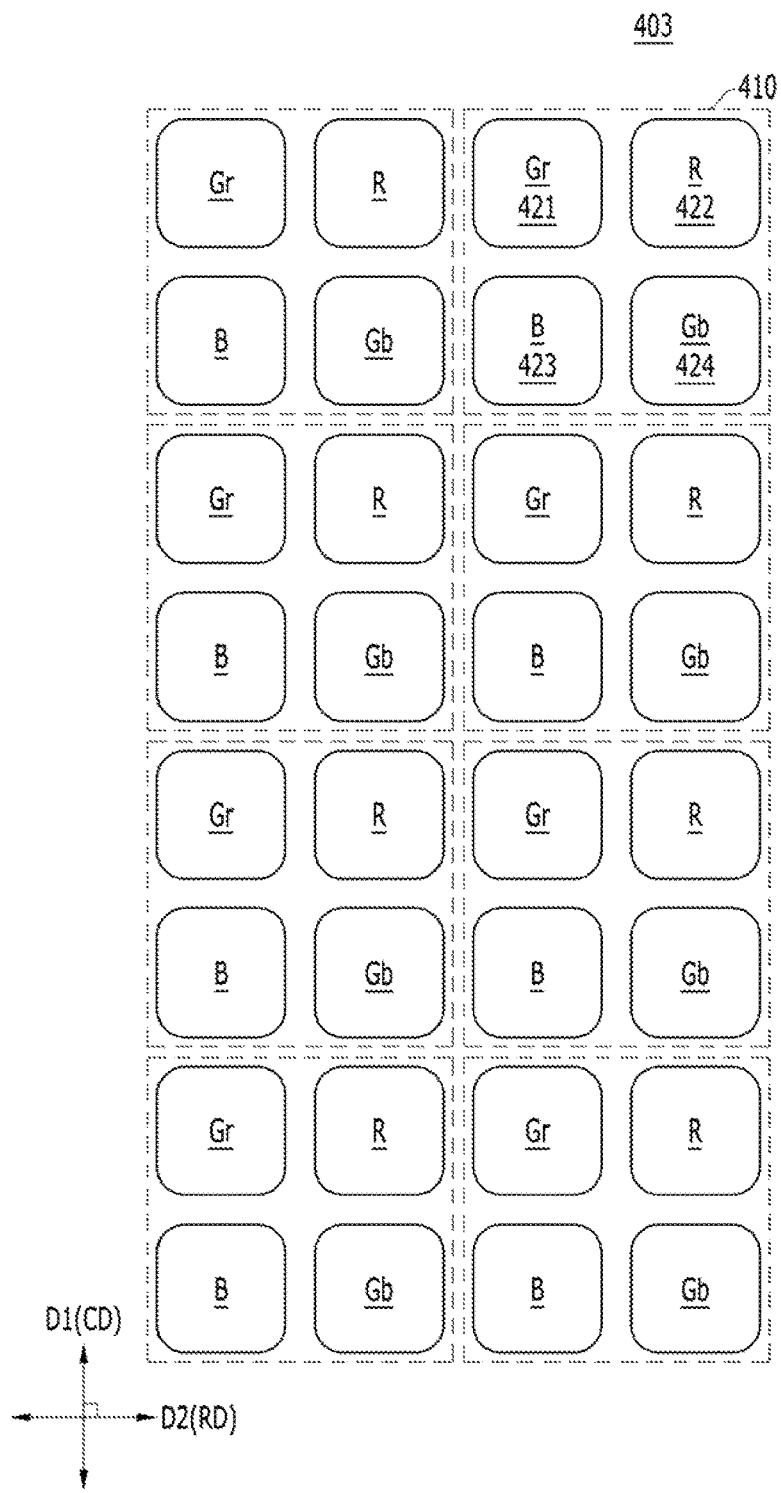
FIG. 10 is a plan view illustrating a portion of a color filter array corresponding to the portion of the pixel array of the image sensor in accordance with the third embodiment of the present invention.

FIG. 9 is a plan view illustrating a portion of a pixel array of an image sensor in accordance with a third embodiment of the present invention, and FIG. 10 is a plan view illustrating a portion of a color filter array corresponding to the portion of the pixel array of the image sensor in accordance with the third embodiment of the present invention. For simplicity, the same reference symbols as the first embodiment are used herein.

Referring to FIG. 9, the image sensor in accordance with the third embodiment may include a pixel array 303 in which a plurality of sub pixel arrays 307 are arranged two-dimensionally. Each of the plurality of sub pixel arrays 307 may include a plurality of pixel blocks 310 which are arranged in a matrix structure. Thus, the pixel array 303 may include a plurality of pixel blocks 310 which are arranged in an M×N (where M and N are natural numbers) matrix structure. That is to say, the pixel array 303 may include the plurality of pixel blocks 310 which are arranged in an M direction and an N direction. The M direction and the N direction may be a row direction RD and a column direction CD, respectively. Each of the plurality of pixel blocks 310 may include a plurality of unit pixels which are arranged in an m×n (where m and n are natural numbers) matrix structure and have a shared pixel structure.

For example, in the third embodiment of the present invention, each of the plurality of sub pixel arrays 307 may include a (1,1) first pixel block 310-1, a (1,2) second pixel block 310-2, a (2,1) third pixel block 310-3 and a (2,2) fourth pixel block 310-4 which are arranged in a 2×2 matrix structure. Similarly to the comparative example, each of the plurality of pixel blocks 310 may have a 4-shared pixel structure which includes 4 unit pixels arranged in a 2×2 matrix structure. It is noted that the illustrated structure is just an example, and the image sensor in accordance with the third embodiment may have a $2^n$ (where n is a natural number)-shared pixel structure. Descriptions will be made later for each of the plurality of pixel blocks 310.

Referring to FIG. 10, the image sensor in accordance with the third embodiment may include a color filter array 403 corresponding to the pixel array 303. The color filter array 403 may include a plurality of color patterns 410 which are arranged repeatedly to correspond to the plurality of pixel blocks 310, respectively. Each of the plurality of color patterns 410 may include a plurality of color filters corresponding to a plurality of unit pixels, respectively. Each of the plurality of color filters may be a single filter including any one or a multi-filter including at least two, selected from the group consisting of a red filter, a green filter, a blue filter, a cyan filter, a yellow filter, a magenta filter, a white filter, a black filter, an IR cutoff filter, an IR pass filter and a band pass filter which passes a specific wavelength band. For example, each of the plurality of color patterns 410 may include a first color filter 421 to a fourth color filter 424 which are arranged in a 2×2 matrix structure and correspond to a plurality of unit pixels, respectively. In each of the plurality of color patterns 410, the first color filter 421, the second color filter 422, the third color filter 423 and the fourth color filter 424 may be positioned at a left upper part, a right upper part, a left lower part and a right lower part, respectively, and may have the same layout shape over the entire color filter array 403. For example, each of the plurality of color patterns 410 may be a Bayer pattern in which a red filter R, a green filter Gr, a blue filter B, and a second green filter Gb are repeated. In other words, the first color filter 421, the second color filter 422, the third color filter 423 and the fourth color filter 424 may be a first green filter Gr, a red filter R, a blue filter B and a second green filter Gb, respectively.

Meantime, while the third embodiment illustrates the case where each of the plurality of color patterns 410 is a Bayer pattern, it is to be noted that various other color patterns may be applied. For example, each of the plurality of color patterns 410 may be a WRGB pattern which includes a white filter W, a red filter R, a green filter G and a blue filter B.

Referring again to FIG. 9, in the image sensor in accordance with the third embodiment of the present invention, for preventing differences in the image signals outputted from respective unit pixels in a shared pixel structure, the plurality of pixel blocks 310 in each of the plurality of sub pixel arrays 307 may have planar shapes that are symmetrical to each other.

In detail, in the pixel array 303, the plurality of pixel blocks 310 may be arranged in the M×N (where M and N are natural numbers) matrix structure. Among the plurality of pixel blocks 310, when compared to an (M,N) pixel block 310, each of the planar shapes of an (M,N+1) pixel block 310 and an (M,N−1) pixel block 310 which are adjacent to the (M,N) pixel block 310 in the M direction may be obtained by inverting the planar shape of the (M,N) pixel block 310 in the M direction. Furthermore, the planar shapes of an (M+1,N) pixel block 310 and an (M−1,N) pixel block 310 which are adjacent to the (M,N) pixel block 310 in the N direction may also be obtained by inverting the planar shape of the (M,N) pixel block 310 in the M direction. In other words, each of the planar shape of the (M,N+1) pixel block 310, the planar shape of the (M,N−1) pixel block 310, the planar shape of the (M+1,N) pixel block 310 and the planar shape of the (M−1,N) pixel block 310 may be symmetrical to the planar shape of the (M,N) pixel block 310 in a second direction D2. Namely, each of the planar shape of the (M,N+1) pixel block 310, the planar shape of the (M,N−1) pixel block 310, the planar shape of the (M+1,N) pixel block 310 and the planar shape of the (M−1,N) pixel block 310 may be left-right symmetrical to the planar shape of the (M,N) pixel block 310.

Therefore, the planar shape of a pixel block 310 among a plurality of pixel blocks 310 which is adjacent to the (M,N+1) pixel block 310 and the (M,N−1) pixel block 310 in the N direction may be the same as the planar shape of the (M,N) pixel block 310. Also, the planar shape of a pixel block 310 among a plurality of pixel blocks 310 which are is to the (M+1,N) pixel block 310 and the (M−1,N) pixel block 310 in the M direction may be the same as the planar shape of the (M,N) pixel block 310. The planar shape of a pixel block 310 among a plurality of pixel blocks 310 which is adjacent to the (M,N) pixel block 310 in an oblique direction OD1 or OD2 that has a slope with respect to the M direction or the N direction may be the same as the planar shape of the (M,N) pixel block 310. The N direction and the M direction may be a first direction D1 and the second direction D2, respectively, and the first direction D1 and the second direction D2 may be the column direction CD and the row direction RD, respectively.

In the image sensor in accordance with the third embodiment of the present invention, each of the plurality of sub pixel arrays 307 may include the (1,1) first pixel block 310-1, the (1,2) second pixel block 310-2, the (2,1) third pixel block 310-3 and the (2,2) fourth pixel block 310-4 which are arranged in a 2×2 matrix structure. The first pixel block 310-1 and the fourth pixel block 310-4 may have the is same planar shape, and the second pixel block 310-2 and the third pixel block 310-3 may have the same planar shape. Each of the planar shape of the second pixel block 310-2 and the planar shape of the third pixel block 310-3 may be obtained by inverting the planar shape of the first pixel block 310-1 in the second direction D2. That is to say, in the image sensor in accordance with the third embodiment of the present invention, each of the plurality of sub pixel arrays 307 may include two sub pixel arrays 305 of the first embodiment or two sub pixel arrays 306 of the second embodiment of the present invention. Hence, similarly to the first embodiment and the second embodiment described above, the image sensor in accordance with the third embodiment may prevent differences from being caused in the image signals outputted from respective unit pixels.

Figure 11:
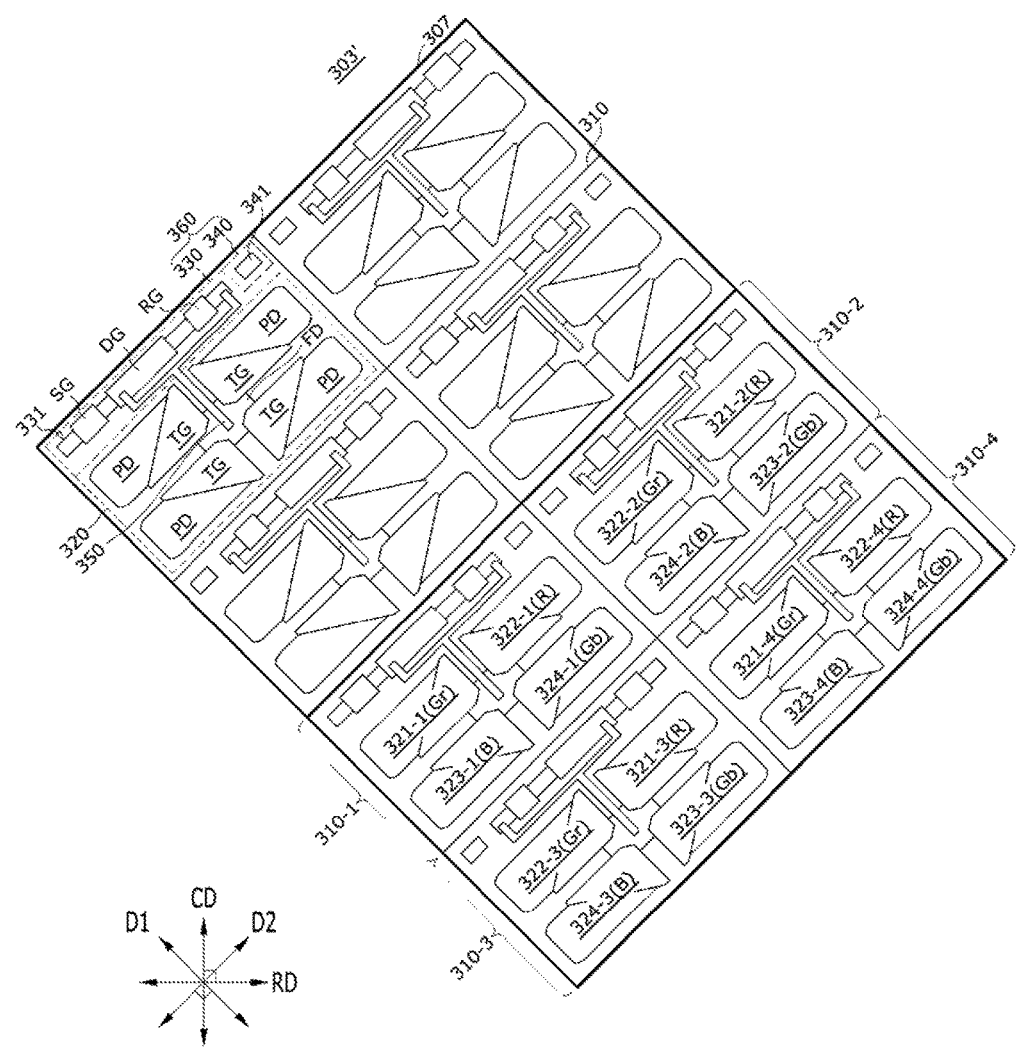
FIG. 11 is a plan view illustrating a portion of a pixel array of an image sensor in accordance with a variation of the third embodiment of the present invention.

FIG. 11 is a plan view illustrating a portion of a pixel array of an image sensor in accordance with a variation of the third embodiment of the present invention. For simplicity, the same reference symbols as the third embodiment are used herein.

Referring to FIG. 11, the image sensor in accordance with the variation of the third embodiment may include a pixel array 303' in which a plurality of sub pixel arrays 307 are arranged two-dimensionally. Each of the plurality of sub pixel arrays 307 may include a plurality of pixel blocks 310 which are arranged in a matrix structure. Thus, the pixel array 303' may include a plurality of pixel blocks 310 which are arranged in an M×N (where M and N are natural numbers) matrix structure. That is to say, the pixel array 303' may include a plurality of pixel blocks 310 which are arranged in a first direction D1 and a second direction D2. The first direction D1 and the second direction D2 may be oblique directions that cross with each other and have slopes with respect to a row direction RD or a column direction CD. The pixel array 303' in accordance with the variation of the third embodiment may be advantageous in securing the layout and interval of wiring lines which extend in the row direction RD and the column direction CD.

Hereinbelow, referring again to FIGS. 3 to 11, detailed descriptions will be made for the plurality of pixel blocks in the image sensors in accordance with the embodiments and the variations thereof described above.

Each of the plurality of pixel blocks 310 may include a light reception unit 320 which includes a plurality of unit pixels having the shared pixel structure and generates photocharges in response to incident light, a driving circuit 360 which outputs an image signal corresponding to the photocharges generated by the light reception unit 320, and a conductive line 350 which electrically couples the light reception unit 320 and the driving circuit 360. The driving circuit 360 may include an output unit 330 which includes a plurality of pixel transistors, and a pickup unit 340 which controls ground potential. While not shown in the drawing, the light reception unit 320, the output unit 330 and the pickup unit 340 may be isolated by an isolation structure.

The light reception unit 320 may include the plurality of unit pixels which share a floating diffusion FD. For example, the light reception unit 320 may include a first unit pixel 321 to a fourth unit pixel 324 which are disposed to surround the floating diffusion FD. The floating diffusion FD may be positioned at a center in the light reception unit 320. Each of the first unit pixel 321 to the fourth unit pixel 324 may include a photoelectric conversion element PD which generates photocharges in response to incident light and a transfer transistor which transfers the photocharges generated in the photoelectric conversion element PD, to the floating diffusion FD in response to a transfer signal. The transfer signal may be applied to a transfer gate TG, and the photoelectric conversion element PD and the floating diffusion FD may serve as the source and the drain of the transfer transistor, respectively.

The output unit 330 may generate an image signal corresponding to the photocharges generated by the light reception unit 320, and output the image signal to a column line (not shown) in response to a select signal applied through a row line (not shown). The output unit 330 may include a reset transistor, a driver transistor and a selection transistor. The reset transistor, the driver transistor and the selection transistor may share one active region 331, and include a reset gate RG, a driver gate DG and a selection gate SG, respectively. The driver gate DG may be positioned at the center of the active region 331 and the reset gate RG and the selection gate SG may be positioned at one side and the other side of the driver gate DG in a second direction D2, respectively. Junction regions (that is sources and drains) may be formed in the active region 331 at both sides of the reset gate RG, the driver gate DG and the selection gate SG. The conductive line 350 may be coupled to the junction region (for example, source) at one side of the reset gate RG and to the driver gate DG, and the column line may be coupled to the junction region at the other side of the selection gate SG. A power supply voltage (VDD) may be applied to the junction region between the driver gate DG and the reset gate RG. The row line may be coupled to the selection gate SG. The output unit 330 may be positioned at one side of the light reception unit 320 in a first direction D1. The first direction D1 and the second direction D2 may be the column direction CD and the row direction RD, respectively.

The conductive line 350 may electrically couple the floating diffusion FD of the light reception unit 320 with the driver gate DG and the source of the reset transistor of the output unit 330.

The pickup unit 340 may control the base potential of the light reception unit 320 and the output unit 330, and may include a pickup region 341. The pickup region 341 may include an impurity region which is formed in a substrate. A predetermined bias, for example, a ground voltage (VSS), may be applied to the substrate formed with the light reception unit 320 and the output unit 330, through the pickup region 341. Similarly to the output unit 330, the pickup unit 340 may be positioned at one side of the light reception unit 320 in the first direction D1 side by side with the output unit 330. That is to say, the pickup unit 340 may be positioned on the same line with the output unit 330 in the second direction D2.

The image sensor in accordance with embodiments of the present invention may be used in various electronic devices or systems. Hereafter, a camera including an image sensor in accordance with embodiments of the present invention will be described with reference to FIG. 12.

Figure 12:
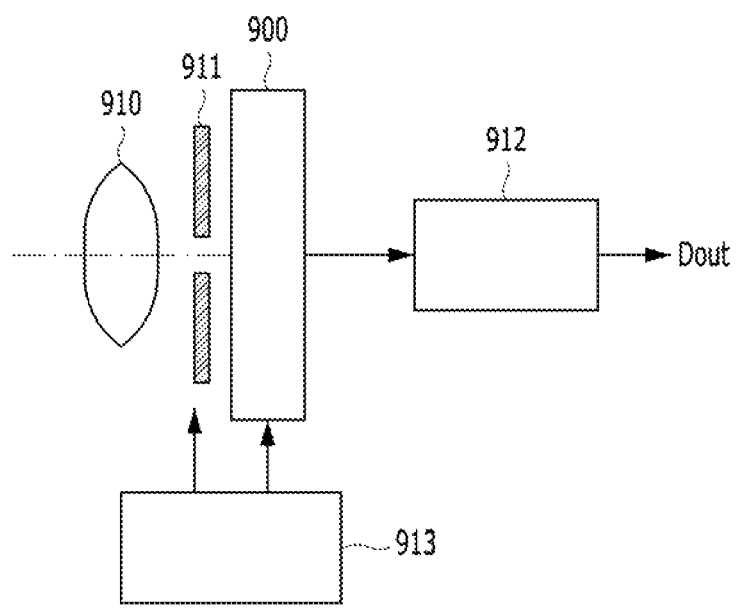
FIG. 12 is a diagram schematically illustrating an electronic device including an image sensor in accordance with an embodiment of the present invention.

FIG. 12 is a diagram schematically illustrating an electronic device including an image sensor in accordance with embodiments of the present invention. Referring to FIG. 12, the electronic device including the image sensor in accordance with embodiments of the present invention may be a camera capable of taking a still image or a moving image. The electronic device may include an optical system or optical lens 910, a shutter unit 911, a driving unit 913 for controlling/driving the image sensor 900 and the shutter unit 911, and a signal processing unit 912.

The optical system 910 may guide image light from an object to a pixel array of the image sensor 900. The optical system 910 may include a plurality of optical lenses. The shutter unit 911 may control a light irradiation period and a light shield period for the image sensor 900. The driving unit 913 may control a transmission operation of the image sensor 900 and a shutter operation of the shutter unit 911. The signal processing unit 912 may process signals outputted from the image sensor 900 in various manners. The processed image signals Dout may be stored in a storage medium such as a memory or outputted to a monitor or the like (not shown).

As is apparent from the above descriptions, in the present technology, since a plurality of pixel blocks which have symmetric planar shapes are provided, it is possible to prevent differences from being caused in the image signals outputted from respective unit pixels.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
a pixel array including a plurality of pixel blocks arranged in an M×N (where M and N are natural numbers) matrix structure,
wherein, among the plurality of pixel blocks, when compared to any one pixel block as a first pixel block, any other one pixel block that is adjacent to the first pixel block in an M direction or an N direction as a second pixel block has a planar shape that is obtained by inverting a planar shape of the first pixel block in the M direction; and
a color filter array corresponding to the pixel array,
wherein each of the plurality of pixel blocks comprises:
a light reception unit including a plurality of unit pixels which generate photocharges in response to incident light and are arranged in an m×n (where m and n are natural numbers) matrix structure to have a shared pixel structure; and
a driving circuit suitable for outputting an image signal corresponding to the photocharges,
wherein the color filter array comprises a plurality of color patterns which are arranged repeatedly to correspond to the plurality of pixel blocks, respectively, and
wherein each of the plurality of color patterns comprises a plurality of color filters which correspond to the plurality of unit pixels, respectively,
wherein, when colors of color filters respectively corresponding to any one unit pixel as a first unit pixel among the plurality of unit pixels in the first pixel block and any one unit pixel as a second unit pixel among the plurality of unit pixels in the second pixel block are the same,
a distance between the first unit pixel and the driving circuit of the first pixel block is different from a distance between the second unit pixel and the driving circuit of the second pixel block.

2. The image sensor according to claim 1, wherein, when the second pixel block is adjacent to the first pixel block in the M direction, a planar shape of any one pixel block among the plurality of pixel blocks which is adjacent to the first pixel block in the N direction is the same as the planar shape of the first pixel block.

3. The image sensor according to claim 1, wherein, when the second pixel block is adjacent to the first pixel block in the N direction, a planar shape of any one pixel block among the plurality of pixel blocks which is adjacent to the first pixel block in the M direction is the same as the planar shape of the first pixel block.

4. The image sensor according to claim 1, wherein any one pixel block among the plurality of pixel blocks which is adjacent to the first pixel block in an oblique direction that has a slope with respect to the M direction or the N direction has a planar shape that is obtained by inverting the planar shape of the first pixel block in the M direction.

5. An image sensor comprising:
a pixel array including a plurality of pixel blocks arranged in a matrix structure; and
a color filter array corresponding to the pixel array,
wherein, among the plurality of pixel blocks, when compared to any one pixel block as a first pixel block, any other one pixel block that is adjacent to the first pixel block in a row direction or a column direction has a planar shape that is left-right symmetrical to a planar shape of the first pixel block, and
wherein each of the plurality of pixel blocks comprises:
a light reception unit including a first unit pixel to a fourth unit pixel which generate photocharges in response to incident light and are arranged in a 2×2 matrix structure to have a shared pixel structure; and
a driving circuit suitable for outputting an image signal corresponding to the photocharges,
wherein the color filter array comprises a plurality of color patterns which are arranged repeatedly to correspond to the plurality of pixel blocks, respectively, and
wherein each of the plurality of color patterns comprises a plurality of color filters corresponding to the first unit pixel to the fourth unit pixel, respectively,
wherein when, in each of the plurality of pixel blocks, the first unit pixel is positioned at a shortest distance from the driving circuit and the fourth unit pixel is positioned at a longest distance from the driving circuit,
the first unit pixel, the second unit pixel, the third unit pixel and the fourth unit pixel in the first pixel block are positioned at a left upper part, a right upper part, a left lower part and a right lower part, respectively, and
the first unit pixel, the second unit pixel, the third unit pixel and the fourth unit pixel in the second pixel block are positioned at a right upper part, a left upper part, a right lower part and a left lower part, respectively.

6. The image sensor according to claim 5, wherein, when the second pixel block is adjacent to the first pixel block in the row direction, a planar shape of any one pixel block among the plurality of pixel blocks which is adjacent to the first pixel block in the column direction is the same as the planar shape of the first pixel block.

7. The image sensor according to claim 5, wherein, when the second pixel block is adjacent to the first pixel block in the column direction, a planar shape of any one pixel block among the plurality of pixel blocks which is adjacent to the first pixel block in the row direction is the same as the planar shape of the first pixel block.

8. The image sensor according to claim 5, wherein any one pixel block among the plurality of pixel blocks which is adjacent to the first pixel block in an oblique direction that has a slope with respect to the row direction or the column direction has a planar shape that is left-right symmetrical to the planar shape of the first pixel block.

9. The image sensor according to claim 5, wherein color filters corresponding to unit pixels of the same position in the first pixel block and the second pixel block, respectively, are the same in color.

10. The image sensor according, to claim 5,
wherein colors of color filters respectively corresponding to the first unit pixel of the first pixel block and the second unit pixel of the second pixel block are the same,
wherein colors of color filters respectively corresponding to the second unit pixel of the first pixel block and the first unit pixel of the second pixel block are the same,
wherein colors of color filters respectively corresponding to the third unit pixel of the first pixel block and the fourth unit pixel of the second pixel block are the same, and wherein colors of color filters respectively corresponding to the fourth unit pixel of the first pixel block and the third unit pixel of the second pixel block are the same.

11. An image sensor comprising:
a pixel array including a first pixel block and a second pixel block adjacent to the first pixel block;
wherein the first pixel block includes:
a first light reception unit having four first photoelectric conversion elements arranged in a matrix form and a first floating diffusion at center of the first photoelectric conversion elements; and
a first driving circuit,
wherein the second pixel block includes:
a second light reception unit having four second photoelectric conversion elements arranged in a matrix form and a second floating diffusion at center of the second photoelectric conversion elements; and
a second driving circuit,
wherein planar shapes of the first light reception unit and the second light reception unit are the same, and
planar shapes of the first driving circuit and the second driving circuit are symmetric with each other.

12. The image sensor of claim 11, wherein:
the first driving circuit includes a first output unit having a first active region, and a first selection gate, a first driver gate, and a first reset gate on the first active region,
the second driving circuit includes a second output unit having a second active region, and a second selection gate, a second driver gate, and a second reset gate on the second active region, and
a planar shape of the first output unit and a planar shape of the second output unit are symmetric with each other.

13. The image sensor of claim 12, wherein:
the first driving circuit further includes a first pickup unit having a first pickup region,
the second driving circuit further includes a second pickup unit having a second pickup region, and
wherein a distance of the first pickup unit and the second pickup unit are shorter than a distance of the first output unit and the second output unit.

14. The image sensor of claim 12, wherein:
the first pixel block further includes a first conductive line connecting the first floating diffusion to the first driver gate and a portion of the first active region,
the second pixel block further includes a second conductive line connecting the second floating diffusion to the second driver gate and a portion of the second active region, and
a planar shape of the first conductive line and a planar shape of the second conductive line are symmetric with each other.

15. The image sensor of claim 11, wherein:
the first light reception unit further include four first transfer gates,
the second light reception unit further include four second transfer gates, and
a planar shape of the first transfer gates and the planar shape of the second transfer gates are the same.

* * * * *